(12) United States Patent
Zhang et al.

(10) Patent No.: US 9,640,725 B2
(45) Date of Patent: May 2, 2017

(54) NITRIDE LIGHT-EMITTING DIODE

(71) Applicant: XIAMEN SANAN OPTOELECTRONICS TECHNOLOGY CO., LTD., Xiamen (CN)

(72) Inventors: Dongyan Zhang, Xiamen (CN); Duxiang Wang, Xiamen (CN); Xiaofeng Liu, Xiamen (CN); Shasha Chen, Xiamen (CN); Liangjun Wang, Xiamen (CN)

(73) Assignee: XIAMEN SANAN OPTOELECTRONICS TECHNOLOGY CO., LTD., Xiamen (CN)

(*) Notice: Subject to any disclaimer, the term of this patent is extended or adjusted under 35 U.S.C. 154(b) by 0 days.

(21) Appl. No.: 15/145,782

(22) Filed: May 3, 2016

(65) Prior Publication Data
US 2016/0247970 A1   Aug. 25, 2016

Related U.S. Application Data

(63) Continuation of application No. PCT/CN2014/086712, filed on Sep. 17, 2014.

(30) Foreign Application Priority Data

Nov. 11, 2013 (CN) .......................... 2013 1 0555496

(51) Int. Cl.
H01L 33/04 (2010.01)
H01L 33/32 (2010.01)
H01L 33/00 (2010.01)
H01L 33/06 (2010.01)
H01L 33/12 (2010.01)
H01L 35/34 (2006.01)

(52) U.S. Cl.
CPC .......... H01L 33/32 (2013.01); H01L 33/0025 (2013.01); H01L 33/0075 (2013.01); H01L 33/04 (2013.01); H01L 33/06 (2013.01); H01L 33/12 (2013.01); H01L 35/34 (2013.01)

(58) Field of Classification Search
CPC ............................... H01L 33/04; H01L 35/34
USPC ....................................... 257/13; 438/37, 46
See application file for complete search history.

(56) References Cited

U.S. PATENT DOCUMENTS

2008/0078439 A1* 4/2008 Grundmann ...... H01L 31/03529
                                                                   136/249
2008/0277682 A1* 11/2008 Mishra .................... H01L 33/04
                                                                    257/98
2010/0037942 A1* 2/2010 Borland ................... H01B 1/06
                                                                   136/255

* cited by examiner

Primary Examiner — George Fourson, III
(74) Attorney, Agent, or Firm — Syncoda LLC; Feng Ma; Junjie Feng

(57) ABSTRACT

A nitride light-emitting diode includes a substrate, an n-type nitride layer, a light-emitting layer, a p-type nitride layer, a p+ layer, an AlInN layer, an n+ layer, and an ITO transparent electrode. A tunneling structure with an AlInN intermediate layer is adopted as the contact layer, which generates polarization charges at the tunneling junction interface and maintains effective width of the depletion region, thereby increasing tunneling probability of holes and reducing contact resistances.

19 Claims, 5 Drawing Sheets

Highly-doped n-type nitride layer

Highly-doped p-type nitride layer

AlInGaN layer

NITRIDE LIGHT-EMITTING DIODE

CROSS-REFERENCE TO RELATED APPLICATIONS

The present application is a continuation of, and claims priority to, PCT/CN2014/086712 filed on Sep. 17, 2014, which claims priority to Chinese Patent Application No. 201310555496.4 filed on Nov. 11, 2013. The disclosures of these applications are hereby incorporated by reference in their entirety.

BACKGROUND

With constant development of the nitride light-emitting diode (LED) technologies, optoelectronic devices such as LEDs are widely applied in fields including solid-state display, lighting, signal light, etc. Though replacement of conventional light sources with GaN-based LEDs has become an irreversible trend, higher electro-optical conversion efficiency is required for it to completely replace existing lighting and display technologies.

SUMMARY

The present disclosure relates in general to the semiconductor optoelectronic device fabrication field, and more specifically to the fabrication technology of nitride semiconductor LEDs.

Some embodiments of the present disclosure provide a light-emitting diode with a tunneling contact layer and a fabrication method thereof, wherein, the tunneling contact layer comprises an AlInGaN layer to optimize the energy band structure of the contact layer. In this disclosure, the polarization charges from lattice mismatch increase the tunneling probability of holes and reduce the working voltage of the light-emitting diode. Advantageously, working voltage and facilitate heat dissipation of the devices can be reduced according to some embodiments.

Technical approaches may include: a nitride light-emitting diode is provided, comprising a substrate, an n-type nitride layer, a light-emitting layer, a p-type nitride layer, a p+ nitride layer, an AlInN layer and an n+ nitride layer. According to some embodiments, the nitride light-emitting diode also comprises a low-temperature buffer layer, an electron blocking layer and a transparent conducting layer. The p+ nitride layer, the AlInGaN layer and the n+ nitride layer constitute a tunneling junction, and the polarization charges at the interfaces among the AlInGaN layer, p+ and n+ nitride layers from lattice mismatch increase the tunneling probability of holes and reduce the resistivity.

In some embodiments, the forbidden band width of the p+ nitride layer and n+ nitride layer in the tunneling junction is larger than the maximum forbidden band width of the AlInGaN layer.

In some embodiments, the doping concentration of the p+ nitride layer in the tunneling junction is 1E19-1E21 $cm^{-3}$ and thickness 0.1-20 nm; the doping concentration of the n+ nitride layer is 1E19-1E21 $cm^{-3}$ and thickness 0.1-20 nm.

In some embodiments, the AlInGaN layer is 0.1-20 nm thick.

In some embodiments, the band gap width of the AlInGaN layer is larger than the forbidden band width of the quantum well to prevent the AlInGaN layer from absorbing light emitted from the quantum well region.

In some embodiments, the AlInGaN layer has gradient compositions. In some embodiments, in the AlInGaN gradient layer, the indium compositions initially increase and then decrease, forming an inverted V-type gradient structure, and the middle of the AlInGaN gradient layer has highest indium compositions. In some embodiments, in the AlInGaN gradient intermediate layer, the aluminum compositions initially decrease, then remain unchanged and finally increase, forming a trapezoidal gradient structure. In some embodiments, a combination of simultaneous gradient of indium and aluminum compositions is provided. In some embodiments, the gradient can be in sinusoidal, serrated or stepped shapes or any two or more of their combinations.

The nitride light-emitting diode is formed as follows: providing a substrate; forming a low-temperature buffer layer, a non-doping nitride layer, an n-type nitride layer, a light-emitting layer, an electron blocking layer, a p-type nitride layer, a p+ nitride layer, an AlInGaN gradient intermediate layer and an n+ nitride layer in successive; wherein, the p+ nitride layer, the AlInGaN gradient intermediate layer and the n+ nitride layer constitute a tunneling junction.

In some embodiments, growth temperature of the n+ nitride layer and the p+ nitride layer is 850-1,000° C.

In some embodiments, growth temperature of the AlInGaN layer is 700-900° C.

In some embodiments, the growth is at crystallographic C direction, and the polarity is Ga-polarity.

In some embodiments, the growth is at crystallographic C direction, and the polarity is N-polarity.

According to some embodiments, compared with conventional highly-doped p-type layer, the highly-doped n-type layer has low material resistivity and low electronic work function, which, as the contact layer with the semiconductor transparent electrode, can increase the uniformity of current lateral distribution at hole injection; introduction of the AlInGaN layer in the tunneling structure can maintain the interface polarization charges at effective density and reduce the average band gap width of the depletion region. This results in a higher probability of holes' tunneling from the highly-doped n-type nitride layer to the highly-doped p-type nitride layer. Moreover, the injection current is increased, resistivity is reduced and the hole injection efficiency is improved. In some embodiments, device heat exhaust can be eliminated or reduced, and heat dissipation can be improved.

Other embodiments and implementations may become apparent in view of the following description and drawings.

DETAILED DESCRIPTION

The embodiments of the present disclosure will be described in detail with reference to the accompanying drawings to help understand the substantive features and practicability of the disclosed nitride light-emitting diode with a tunneling contact layer and the fabrication method thereof. However, it will be understood that the disclosure is not limited to the embodiments disclosed below.

Embodiment 1

Figure 1:
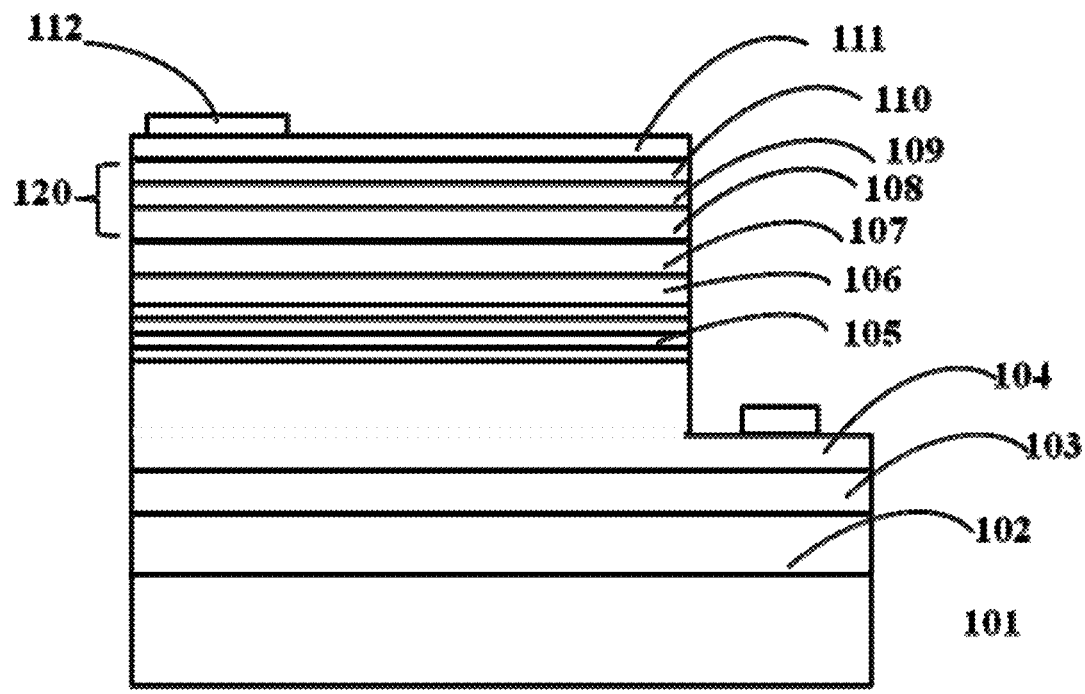
FIG. 1 is a section view of a nitride light-emitting diode according to Embodiment 1.

FIG. 1 is a brief sectional view of the nitride light-emitting diode according to this present disclosure. As shown, the nitride light-emitting diode comprises, from bottom to up, a substrate 101, a low-temperature buffer layer 102, a non-doping nitride layer 103, an n-type nitride layer 104, a multi-quantum well region 105, an electron blocking layer 106, a p-type nitride layer 107, a p+ nitride layer 108, an AlInN layer 109, an n+ nitride layer 110 and an ITO transparent electrode layer 111, wherein, the p+ nitride layer 108, the AlInGaN layer 109 and the n+ nitride layer 110 constitute a tunneling junction. In the tunneling structure, the polarization charges at interface among the AlInGaN layer, highly-doped p+ and n+ nitride layers from lattice mismatch increase the tunneling probability of holes and reduce the resistivity and the working voltage of the light-emitting diode.

Figure 2:
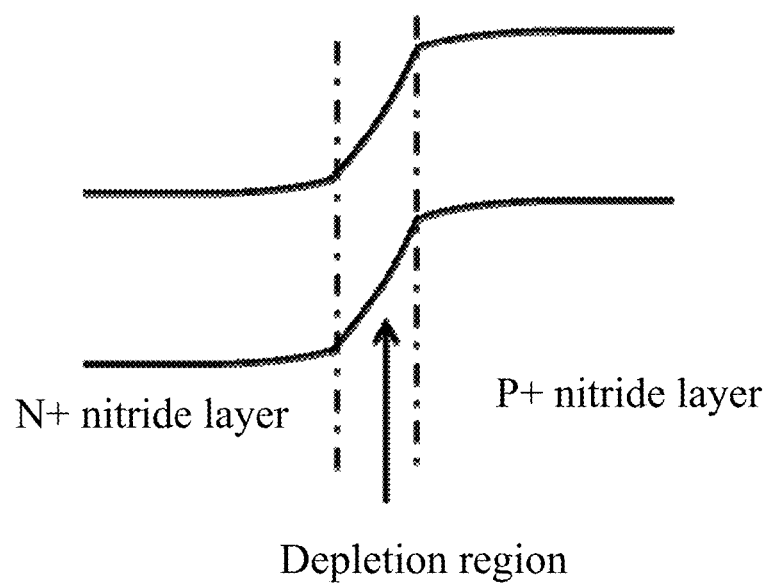
FIG. 2 is an energy band diagram of the tunneling structure of a conventional light-emitting diode.
Figure 3:
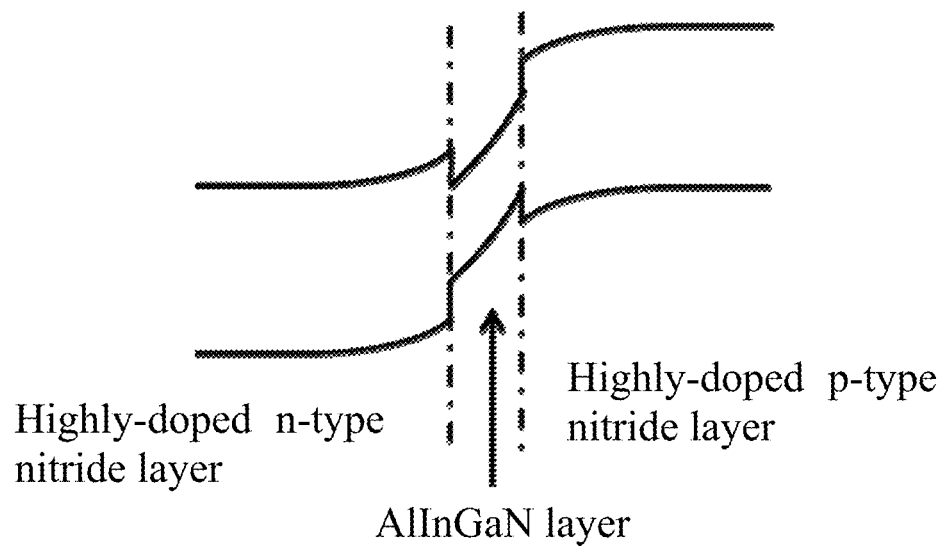
FIG. 3 is an energy band diagram of the tunneling structure of the nitride light-emitting diode according to Embodiment 1.
Figure 4:
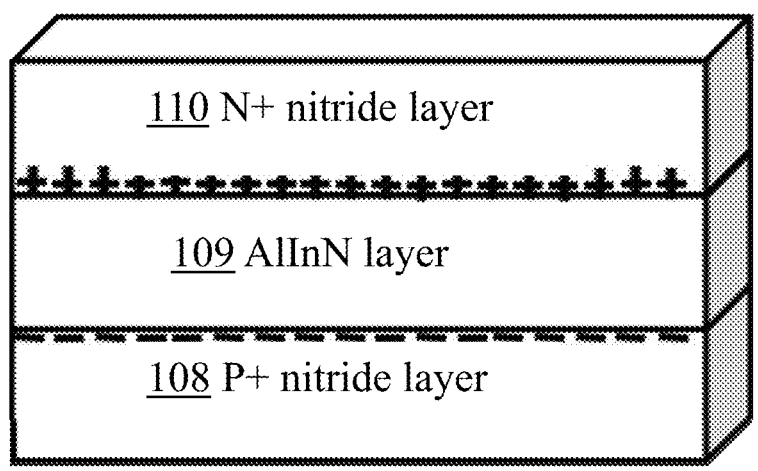
FIG. 4 is an distribution chart of the polarization charges of the tunneling structure according to Embodiment 1.

FIG. 3 illustrates the energy band structure of the tunneling junction as shown above. Compared with conventional tunneling junction without an intermediate layer (refer to FIG. 2 for the energy band structure), the tunneling junction disclosed in this method has an AlInGaN layer 109 with narrower band gap width and the intermediate layer 109 with thickness of 0.1-20 nm is at the depletion region of a conventional tunneling junction. Due to lattice difference between the AlInGaN and the n+ and p+ nitride layers, polarization charges and polarization fields are generated at the interface caused by piezoelectric polarization effect. Refer to FIG. 4 for distribution of the polarization charges.

Specifically, the tunneling probability of the tunneling structure as shown above should meet the Expression below:

$$p_t \propto \exp(-\pi \times m^{*1/2} \times E_g^{3/2} / 2\sqrt{2}\, e \times \hbar \times E) \quad (1)$$

where $P_t$: carrier tunneling probability, $m^*$: effective mass of tunneling carriers, e: electron charge, $E_g$, E: forbidden band width and electric field of assisted tunneling region material.

Increasing tunneling probability is an effective method to reduce device working voltage. As shown in Expression (1), in order to increase tunneling probability $P_t$, it is necessary to decrease the material forbidden band width $E_g$ or to increase the electric field E of the depletion region. Compared with the conventional tunneling structure without a gradient intermediate layer, the AlInGaN layer has a smaller forbidden band width to increase tunneling probability; in addition, the piezoelectric polarization field and polarization charges further increase the tunneling probability of carriers.

Embodiment 2

This embodiment differs from Embodiment 1 in that: the AlInGaN layer 109 in the tunneling junction is a composition gradient layer. Detailed descriptions will be given with reference to the fabrication method.

(1) Grow a Highly-Doped p-Type Nitride Layer 108

In the MOCVD (Metal Organic Chemical Vapor Deposition) reaction chamber, after growth of the p-type nitride layer 107, keep the epitaxial wafer surface temperature at 800-1,000° C. (preferably 930° C.). Grow the highly-doped p-type nitride layer 108 under the conditions below: growth reaction chamber pressure: 50-500 mbar, and preferably 200 mbar; Ga source and N source: TMGa and $NH_3$; carrier gas: $H_2$; and dopant: Cp2Mg. Growth thickness is 0.1-20 nm and doping concentration is 1E19-1E21 $cm^{-3}$.

(2) Grow an AlInGaN Layer 109

Figure 5:
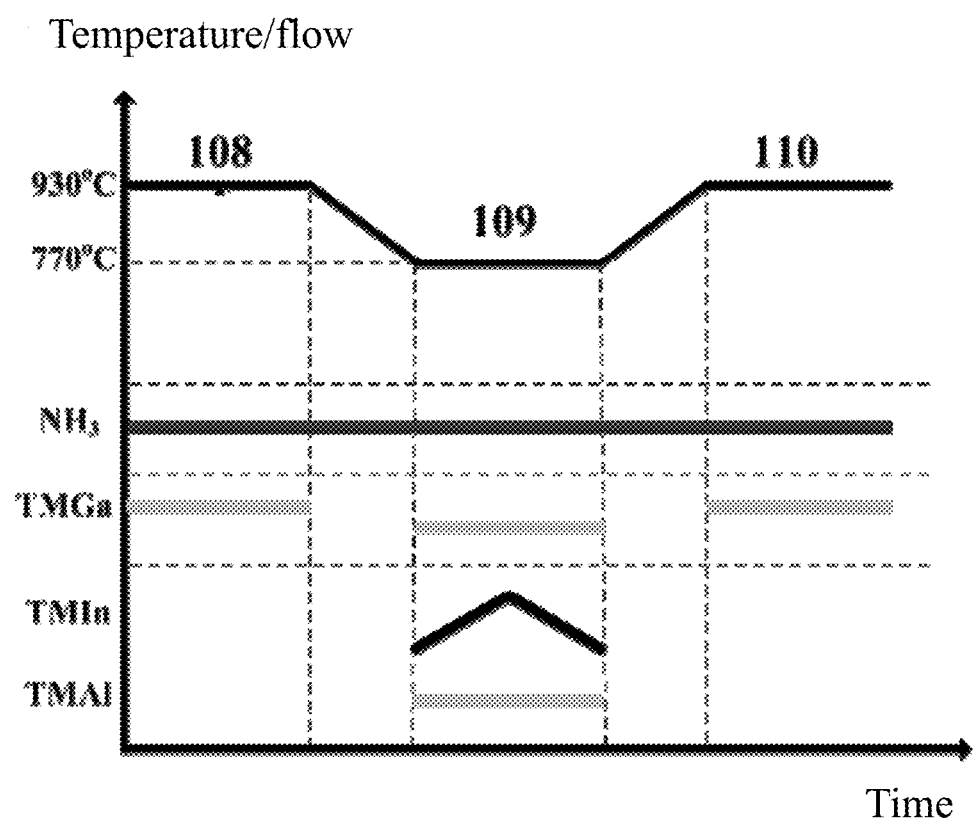
FIG. 5 is a schematic diagram of the tunneling structure growth of the nitride light-emitting diode according to Embodiment 2.

Grow an AlInGaN layer 109 over the highly-doped p-type nitride layer 108 under growth conditions as below: reaction chamber pressure: 50-500 mbar, and preferably 200 mbar; substrate temperature: 650° C.-850° C., and preferably 770° C.; Ga, In, Al and N sources: TMGa, TMIn, TMAl and $NH_3$; and carrier gas: $H_2$. FIG. 5 is a temperature- and flow-time schematic diagram during growth of tunneling junction 120. When the AlInGaN layer is grown, flows of TMGa, TMAl and $NH_3$ remain unchanged, and TMIn flow changes from initial value to maximum value and then goes back to the initial value. In this way, the indium compositions in the epitaxial layer increase firstly and then decrease, thus forming an energy band structure as shown in FIG. 3. The initial value of the indium compositions in AlInGaN gradient layer is 5-10%, and maximum value is 10-20%. Thickness is 0.1-20 nm.

Figure 6:
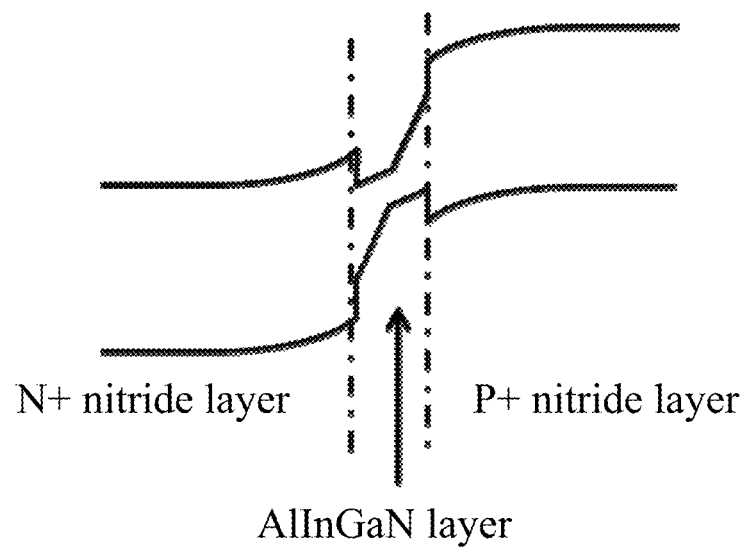
FIG. 6 is an energy band diagram of the tunneling structure of the nitride light-emitting diode according to Embodiment 2.

When the indium compositions of the AlInGaN layer contact the nitride layers at two sides at 5%-10% initial value, a certain amount of polarization charges are generated at the interface and a depletion region of 0.1-20 nm is generated inside the gradient intermediate layer. It should be noted that, a high initial value can widen the depletion region, and conversely, reduce the tunneling probability. The AlInGaN layer 109 with gradient compositions can obtain a 0.1-20 nm depletion region width, thus reducing resistivity, while the polarization charges increase the tunneling probability. FIG. 6 is the energy band diagram of the tunneling structure of the nitride light-emitting diode according to this embodiment.

(3) Grow a Highly-Doped n-Type Nitride Layer 110

Grow a highly-doped n-type nitride layer 110 over the AlInGaN gradient layer based on the growth conditions below: after growth of the AlInGaN gradient layer 109, keep the epitaxial wafer surface temperature at 800-1,000° C., and preferably 930° C. Grow the highly-doped n-type nitride layer 110 under the conditions below: growth reaction chamber pressure: 50-500 mbar, and preferably 200 mbar; Ga source and N source: TMGa and $NH_3$; carrier gas: $H_2$; and dopant: $SiH_4$. Growth thickness is 0.1-20 nm and doping concentration is 1E19-1E21 $cm^{-3}$.

Embodiment 3

Figure 7:
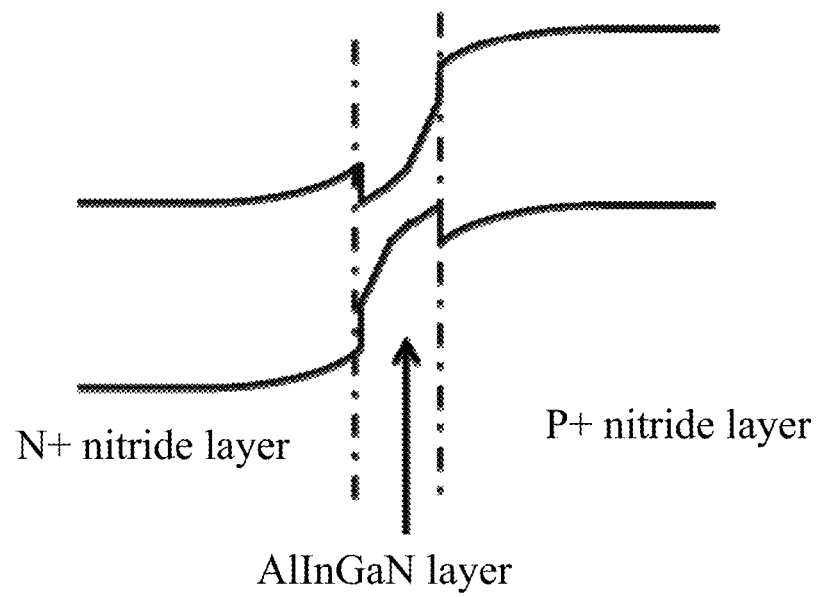
FIG. 7 is an energy band diagram of the tunneling structure of the nitride light-emitting diode according to Embodiment 3.

This embodiment differs from Embodiment 2 in that: when growing the AlInGaN layer 109 with gradient compositions, the TMIn flow changes from initial value to maximum value and keeps for while, preferably, ⅓ of entire growth period of the gradient layer, and goes back to the initial value, to enable the energy band change in a shape as shown in FIG. 7. In this way, the average indium compositions in the gradient intermediate layer are further increased, the average forbidden band width $E_g$ is reduced, and the tunneling probability is increased.

Embodiment 4

This embodiment differs from Embodiment 2 in that: when growing the AlInGaN layer 109 with gradient compositions, the other source flows remain unchanged, yet the TMAl flow changes from initial value to minimum value and goes back to initial value. This gradient method also enables the energy band change in a shape as shown in FIG. 6, thus reducing average forbidden band width $E_g$ and increasing tunneling probability.

Embodiment 5

Figure 8:
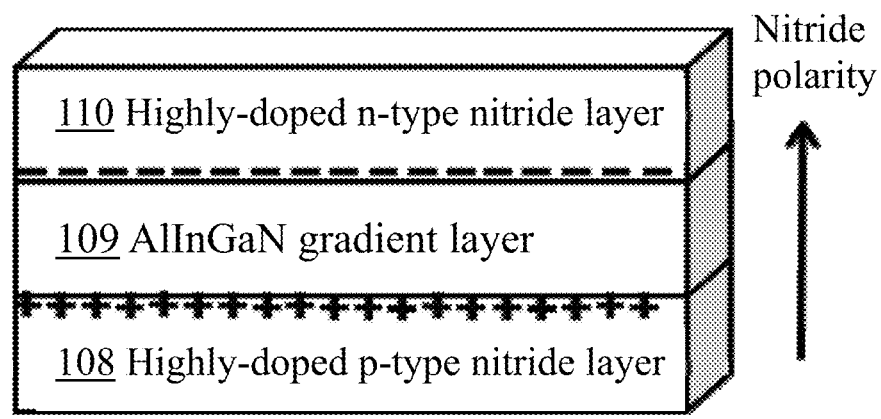
FIG. 8 is a distribution chart of the polarization charges of the tunneling structure according to Embodiment 5.

This embodiment differs from Embodiment 2 in that: when growing tunneling junction 120, the growth plane is in N-polarity. Therefore, positive charges are generated at the interface between the highly-doped p-type layer and the AlInGaN gradient layer. FIG. 8 is a schematic diagram of polarization charge distribution of the tunneling structure at N-polarity growth plane. This enables a consistent direction between the polarization field and the electric field in the p-n junction depletion region, thereby further increasing tunneling probability, reducing resistivity and improving light-emitting diode efficiency.

The nitride LEDs disclosed herein can be used in, for example, lighting, displays, etc. A light-emitting system can include a plurality of the LEDs described herein, and provide a light source for a variety of applications.

Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:
1. A nitride light-emitting diode, comprising:
a substrate;
an n-type nitride layer over the substrate;
a light-emitting layer over the n-type nitride layer;
a p-type nitride layer over the light-emitting layer;
a p+ nitride layer over the p-type nitride layer;
an AlInGaN gradient layer over the p+ nitride layer; and
an n+ nitride layer over the AlInGaN gradient layer;
wherein the p+ nitride layer, the AlInGaN gradient intermediate layer and the n+ nitride layer form a tunneling junction; and
wherein forbidden band width of the AlInGaN gradient layer is configured to be smaller than forbidden band widths of the p+ nitride layer and the n+ nitride layer to thereby increase tunneling probability.

2. The nitride light-emitting diode of claim 1, wherein: polarization charges are generated at interface among the AlInGaN layer, the n+ nitride layer and the p+ nitride layer from lattice mismatch to thereby further increase the tunneling probability.

3. The nitride light-emitting diode of claim 1, wherein: band gap width of the AlInGaN layer is larger than that of the light-emitting layer.

4. The nitride light-emitting diode of claim 1, wherein: the AlInGaN gradient layer has gradient compositions configured to increase the tunneling probability.

5. The nitride light-emitting diode of claim 4, wherein: in the AlInGaN gradient layer, the indium compositions initially increase and then decrease, forming an inverted V-type gradient structure, and the middle of the AlInGaN layer has a highest indium composition.

6. The nitride light-emitting diode of claim 4, wherein: in the AlInGaN gradient layer, the indium compositions initially increase, then remain unchanged and finally decrease, forming a trapezoidal gradient structure.

7. The nitride light-emitting diode of claim 4, wherein: in the AlInGaN gradient layer, the aluminum compositions initially decrease and then increase, forming a trapezoidal gradient structure.

8. The nitride light-emitting diode of claim 4, wherein: in the AlInGaN gradient layer, the aluminum compositions initially decrease, then remain unchanged and finally increase, forming a trapezoidal gradient structure.

9. The nitride light-emitting diode of claim 1, wherein: the AlInGaN gradient layer is 0.1-20 nm thick.

10. The nitride light-emitting diode of claim 1, wherein: doping concentration and thickness of the p+ layer are 1E19-1E21 $cm^{-3}$ and 0.1-20 nm, respectively.

11. The nitride light-emitting diode of claim 1, wherein: doping concentration and thickness of the n+ layer are 1E19-1E21 $cm^{-3}$ and 0.1-20 nm, respectively.

12. A method of forming a nitride light-emitting diode, wherein formed light-emitting diode comprises:
a substrate;
an n-type nitride layer over the substrate;
a light-emitting layer over the n-type nitride layer;
a p-type nitride layer over the light-emitting layer;
a p+ nitride layer over the p-type nitride layer;
an AlInGaN gradient layer over the p+ nitride layer; and
an n+ nitride layer over the AlInGaN gradient layer;
wherein the p+ nitride layer, the AlInGaN gradient intermediate layer and the n+ nitride layer form a tunneling junction;
wherein the AlInGaN gradient layer is grown to have a forbidden band width smaller than forbidden band widths of the p+ nitride layer and the n+ nitride layer to thereby increase tunneling probability;
the method comprising:
growing the p+ nitride layer;
growing the AlInGaN gradient layer over the p+ nitride layer; and
growing the n+ nitride layer over the AlInGaN gradient layer.

13. The method of claim 12, wherein said growing the p+ nitride layer comprises Metal Organic Chemical Vapor Deposition (MOCVD) growth under:
an epitaxial wafer surface temperature of 800-1000° C.;
a growth reaction chamber pressure of 50-500 mbar;
Ga source and N source: TMGa and $NH_3$;
carrier gas: $H_2$; and
dopant: Cp2Mg;
wherein a growth thickness is 0.1-20 nm and a doping concentration is 1E19-1E21 $cm^{-3}$.

14. The method of claim 13, wherein the temperature is about 930° C., and the pressure is about 200 mbar.

15. The method of claim 12, wherein said growing the AlInGaN gradient layer over the p+ nitride layer is under:

a reaction chamber pressure of 50-500 mbar;
a substrate temperature of 650° C.-850° C.;
Ga, In, Al, and N sources: TMGa, TMIn, TMAl, and NH$_3$; and
carrier gas: H$_2$.

16. The method of claim 15, wherein the temperature is about 770° C., and the pressure is about 200 mbar.

17. The method of claim 12, wherein said growing the n+ nitride layer over the AlInGaN gradient layer is under:
an epitaxial wafer surface temperature at 800-1,000° C.;
a growth reaction chamber pressure: 50-500 mbar;
Ga source and N source: TMGa and NH$_3$;
carrier gas: H$_2$,
dopant: SiH$_4$;
growth thickness: 0.1-20 nm; and
doping concentration: 1E19-1E21 cm$^{-3}$.

18. A light-emitting system comprising a plurality of nitride light-emitting diodes (LEDs), each LED comprising:
a substrate;
an n-type nitride layer over the substrate;
a light-emitting layer over the n-type nitride layer;
a p-type nitride layer over the light-emitting layer;
a p+ nitride layer over the p-type nitride layer;
an AlInGaN gradient layer over the p+ nitride layer; and
an n+ nitride layer over the AlInGaN gradient layer;
wherein the p+ nitride layer, the AlInGaN gradient intermediate layer and the n+ nitride layer form a tunneling junction; and
wherein forbidden band width of the AlInGaN gradient layer is configured to be smaller than forbidden band widths of the p+ nitride layer and the n+ nitride layer to thereby increase tunneling probability.

19. The light-emitting system of claim 18, wherein: polarization charges are generated at interface among the AlInGaN layer, the n+ nitride layer and the p+ nitride layer from lattice mismatch to thereby further increase the tunneling probability.

* * * * *